United States Patent [19]

Clement et al.

[11] Patent Number: 4,972,188

[45] Date of Patent: Nov. 20, 1990

[54] PUSH PULL DOUBLE DIGITAL-TO-ANALOG CONVERTER

[75] Inventors: Clay S. Clement, Rock Tavern; Cecil T. Ho, Poughkeepsie, both of N.Y.

[73] Assignee: International Business Machines Corporation, Armonk, N.Y.

[21] Appl. No.: 407,847

[22] Filed: Sep. 15, 1989

[51] Int. Cl.$^5$ .............................................. H03M 1/08
[52] U.S. Cl. .................................... 341/118; 341/127; 341/144
[58] Field of Search ............... 341/144, 145, 118, 127, 341/126

[56] References Cited

U.S. PATENT DOCUMENTS 4,766,328 8/1988 Yang ................................ 341/118 X Primary Examiner—William M. Shoop, Jr.
Assistant Examiner—Sharon D. Logan
Attorney, Agent, or Firm—Graham S. Jones, II

[57] ABSTRACT

A push pull digital-to-analog converter circuit configuration improves the signal-to-noise ratio when used in the common bipolar (both positive and negative) mode of operation, thereby improving its absolute accuracy. Digital data is supplied to a data buffer which includes an inverter. The inverter supplies the data to one of a pair of push pull connected DACS, referred to as dual DACS. The buffer supplies the data to the other DAC without inversion. The outputs of the pair of DACS are combined by an op-amp circuit which takes the two analog outputs from those circuits and combines them while the push pull circuits are opposed so noise is reduced and accuracy of the conversion is enhanced.

4 Claims, 2 Drawing Sheets

PUSH PULL DOUBLE DIGITAL-TO-ANALOG CONVERTER

BACKGROUND OF THE INVENTION

1. Field of the Invention

The present invention relates to a Digital-to-Analog Converter (DAC) circuit configuration for improving the signal-to-noise ratio when using a DAC in the common bipolar (both positive and negative) mode of operation, thereby improving its absolute accuracy.

2. Description of Related Art

Digital Word Split into Portions

One use of a plurality of DACs in a combined unit is to improve the processing of digital words by breaking up a digital word into higher order and lower order sets of digits and to process each in a separate DAC using voltages divided down by a common ladder of resistors (i.e. a multitap potentiometer.)

For example, U.S. Pat. No. 4,198,622 of Connolly et al for a "Double Digital-to-Analog Converter" shows two digital-to-analog converters coupled in series across a reference potential source with a resistor ladder and a switching tree. A digital word is split into two portions. Each portion operates one switching tree. In FIGS. 4, 4a, and 5 of Connolly et al a circuit is shown which uses a single resistor ladder with two 2-bit DACs having output lines 84 and 91 connected in opposition to a buffer 93 so that the upper two bits have the lower two bits subtracted from them. Since one reference and a common switching tree are used, no noise advantage can be gained. Since Vref and ground are used across the resistor ladder, only a unipolar output is available. To get bipolar operation, an offset reference must be used, increasing the noise. The chief objective of the Connolly et al patent is a parts reduction over the DACS preceding Connolly et al. The subtraction in Connolly et al is actually a partitioning of the ranges between the two DACS. It appears that either addition or subtraction can be used as a matter of architecture in the Connolly et al approach.

Another approach is taught in U.S. Pat. No. 4,494,107 of Kearns et al for "Digital to Analog Converter", which describes a converter which converts two digital words. A ladder network is connected to the plus (+) input of a differential amplifier and another set of digital inputs are connected to the minus (−) input of the same differential amplifier. In the claim of the Kearns patent it is clear that the inputs to the two ladders are a first part of a digital word going to one ladder and a second part of the digital word having its maximum value slightly less than the least change in the first part of the digital word. In summary two DACs and an amplifier are integrated into a single circuit.

An alternative example of a system for using a digital word split into portions is described in U.S. Pat. No. 4,503,421 of Hareyama et al for "Digital to Analog Converter". From one input digital signal that system produces two different digital words. (For example, the most significant bits and one or more subsets of the original digital signal.) These new digital signals are applied to at least two DACs and the DACs' outputs are summed to produce the output of the overall system.

Sub-ranging

Another use of plural DACs is sub-ranging which involves a distinct form of conversion process as described in U.S. Pat. No. 4,430,642 of Weigand et al for "Digital-to-Analog Converter". That patent employs sub-ranging to improve accuracy and offset is used to move and diminish the major transition effects at midrange of the error arising at the transition between "0" and "1".

Pulse Width Modulation

Elimination of a second harmonic can be achieved by using a plurality of DACs in a different way. U.S. Pat. No. 4,542,371 of Uchikoshi, entitled "Method of Converting a Digital Signal into an Analog Signal and a Converter Therefor" describes pulse width modulation using two DACs to eliminate a second harmonic signal. The two pulse width signal forming circuits combine to operate with a complementing circuit providing complementary digital data preceding the second of the two pulse width signal forming circuits. The complementary outputs are fed to a mixer circuit, to plus (+) and minus (−) inputs thereof respectively, and then the output is filtered to smooth the digital signal into an analog signal. There is only one DAC which comprises the overall circuit just described.

Ping Pong DACs for Digital TV

Rapid changes in DAC outputs can lead to switching transients which can be disruptive to a TV receiver. Another quite different design to solve that problem is found in U.S. Pat. No. 4,591,832 of Fling et al for "Digital-to-Analog Conversion System as for Use in a Digital TV Receiver." The Fling system uses two parallel inputs to DACS which are used on alternate phases to input data to an analog summing circuit very rapidly, faster than one DAC can update the signal. The patent states that the two DACs are operated in ping pong fashion with their outputs linearly summed. The patent states that this design eliminates switch transient contamination and DC offset problems.

A typical DAC contains analog, electrical current outputs weighted in a binary combination of electrical currents. In the bipolar mode, an internal fixed offset current source is used to shift the output from the unipolar mode to the bipolar mode.

The noise of each current source increases with the amplitude of the current from that current source. A DAC operating in a bipolar mode with +/−1 ma. output current is comprised of a set of current sources producing output currents which add to 2 ma., and a fixed offset current source having an output current of −1 ma. Therefore the output of the DAC has the current amplitude equivalent in scale to the scale of the current source of 1 ma., but has a noise amplitude greater than that of a 2 ma. current source. This poor signal-to-noise ratio results in poor accuracy.

Sign Magnitude Method

There is in common use a method of noise reduction while operating in the bipolar mode using DACs such as the ones described below in connection in this invention. With that bipolar method, often called the sign-magnitude method, only one of the two DACs is used in its unipolar mode. Depending on whether a positive or a negative output is desired at any particular time, the DAC output voltage is switched to either an inverting or a non-inverting amplifier. For example, as the DAC is used in the unipolar mode, to obtain the opposite polarity, the DAC output is inverted when the opposite polarity is desired.

The sign magnitude method yields very good noise figures, but it has a serious drawback. When the zero output offset current of the DAC or current-to-voltage converting amplifier drifts away from zero, the final output offset current will change polarity when the output polarity is switched. Consequently, at the transition point from one polarity of output voltage or current) to another, there will be a discontinuity of the final output voltage equal to twice the offset voltage. In other words, the positive offset in the zero value of the DAC will create a positive shift in one polarity, but a negative shift when the output is inverted to the opposite polarity.

As a result using that circuit design, a discontinuity of twice the amplitude of the offset current is experienced when the DAC output current crosses from one polarity to another. The error resulting from this form of discontinuity is generally not correctable, and will cause a serious problem in most applications.

In the conventional use of a current digital-to-analog converter (DAC) in the bipolar mode, the basically unipolar DAC output is offset by connecting a resistor from the DAC output to a reference voltage, producing an offset current equal and opposite to half the full scale current output of the DAC. The output voltage of the operational amplifier is equal and opposite to the product of the combined offset and DAC current and the feedback resistor R1.

DAC Circuit

In reference to FIG. 1, a prior art form of DAC circuit is shown. A data input bus 10 carries data in digital form which passes to digital data buffer 11 from which it is supplied on bus line 12 in parallel to DAC 13. DAC 13 includes a simple digital-to-analog circuit illustrated as a current source CS1 with an output voltage connected between output line 15 and node 9 which is connected to ground. DAC 13 also includes a voltage (reference) source RS providing an offset current (e.g. a Zener diode.) Source RS is connected in series with an offset current resistor ROFF. Source RS and resistor $R_{OFF}$ are connected in series between output line 14 and through node 9 to ground.

Output line 14 is connected to output line 15 at node 21. Output line 15 is also connected through node 21 to the negative input terminal 20 of an inverting, operational amplifier (op-amp) 17, whose positive input is connected by line 16 through node 9 to ground. The output of op-amp 17 is line 19. Feedback resistor 18 is connected between node 21 and line 19.

In operation, the output line 15 of the DAC 13 is connected to the negative input of op-amp 17 via line 20. The offset current on output line 14 from the DAC 13 is also supplied to node 21 along with the DAC output current on line 15. In this configuration, the offset current from line 14 is always active.

If the total full scale current from the output current from DAC 13 on line 15 is −2 ma, and if the offset current on line 14 is 1 ma, then at − full scale, the DAC current will be turned off, and the total output from the combination would be 1 ma., simply that of the offset current. If the random noise of the offset current is 10 parts per million (ppm), then the output noise is 10 na. If the feedback resistor 18 is 10 kilohms, then the output voltage of the inverting, operational amplifier (op-amp) 17 will be −10 volts, with a noise of 100 nv.

At mid-range, where the desired output is zero, the offset current is 1 ma, the output of DAC 13 on line 15 is −1 ma. Assuming the DAC output on line 15 has 10 ppm of noise, it would have 10 na of output noise; then the total output current of the combination is zero, while the random noise of DAC line 15 and the offset output 14 will be the root sum square of the two noise currents: 14.14 na. Therefore the output, which is zero volts, has a voltage noise of 141.4 nv.

As + full scale of the DAC 13, the DAC current on output line 15 is −2 ma, while the offset current on output line 14 is 1 ma. The net current from the DAC and offset combination is therefore −1 ma. The output voltage is +10 volts on node 19. The noise current of the offset is 10 na as before, while the noise current of the DAC output 15 is 10 ppm, which is na. The total root sum square of the random current noise is 22.36 na, and the output voltage noise is SUMMARY OF THE INVENTION In accordance with this invention, a signal processing system is provided for converting digitally coded input signals into analog signals. The system includes:

(a) a digital data input and an inverter, the inverter having an inverter input and an inverter output, the inverter input being connected to the digital data input, (b) a first digital-to-analog converter having its input coupled to the digital data input, the first converter having a first output for providing a first analog output signal, (c) a second digital-to-analog converter having its input coupled to the digital data input via the inverter output, the converter having a second output for providing a second analog output signal, (d) means for combining the outputs of the first and second digital-to-analog converters having (1) a first input connected to the first output to receive the first analog output signal and (2) a second input connected to the second output to receive the second analog output signal, whereby noise is reduced and accuracy of the conversion is enhanced.

Preferably, in the signal processing system the means for combining includes means for subtractively combining the outputs of the first and second digital-to-analog converters.

Further it is preferred that in the signal processing system the means for combining comprises a difference amplifier including an operational amplifier connected for subtractively combining said outputs of the first and second digital-to-analog converters.

In addition it is preferred that in the system each of the first and second digital-to-analog converters includes an operational amplifier and a current source.

The foregoing and other objects, features and advantages of the invention will be apparent from the more particular description of the preferred embodiments of the invention which follows.

DESCRIPTION OF THE PREFERRED EMBODIMENT

Best Mode and Other Modes of Carrying Out the Invention

Figure 1:
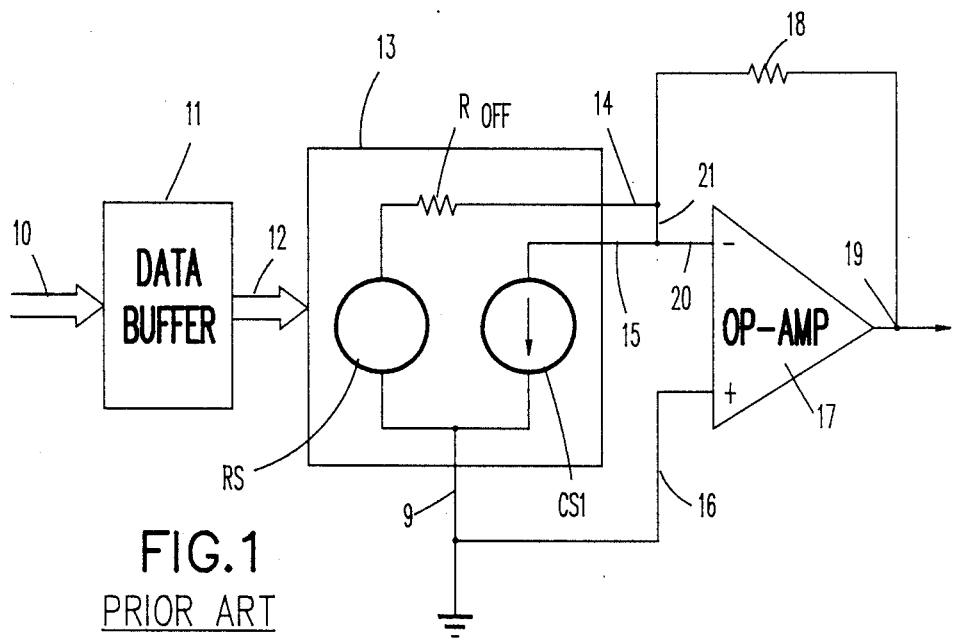
FIG. 1 shows an electrical schematic diagram of a prior art DAC of the kind adapted to be used as a component of one part of a preferred embodiment of this invention. That circuit is described hereinabove.
Figure 2:
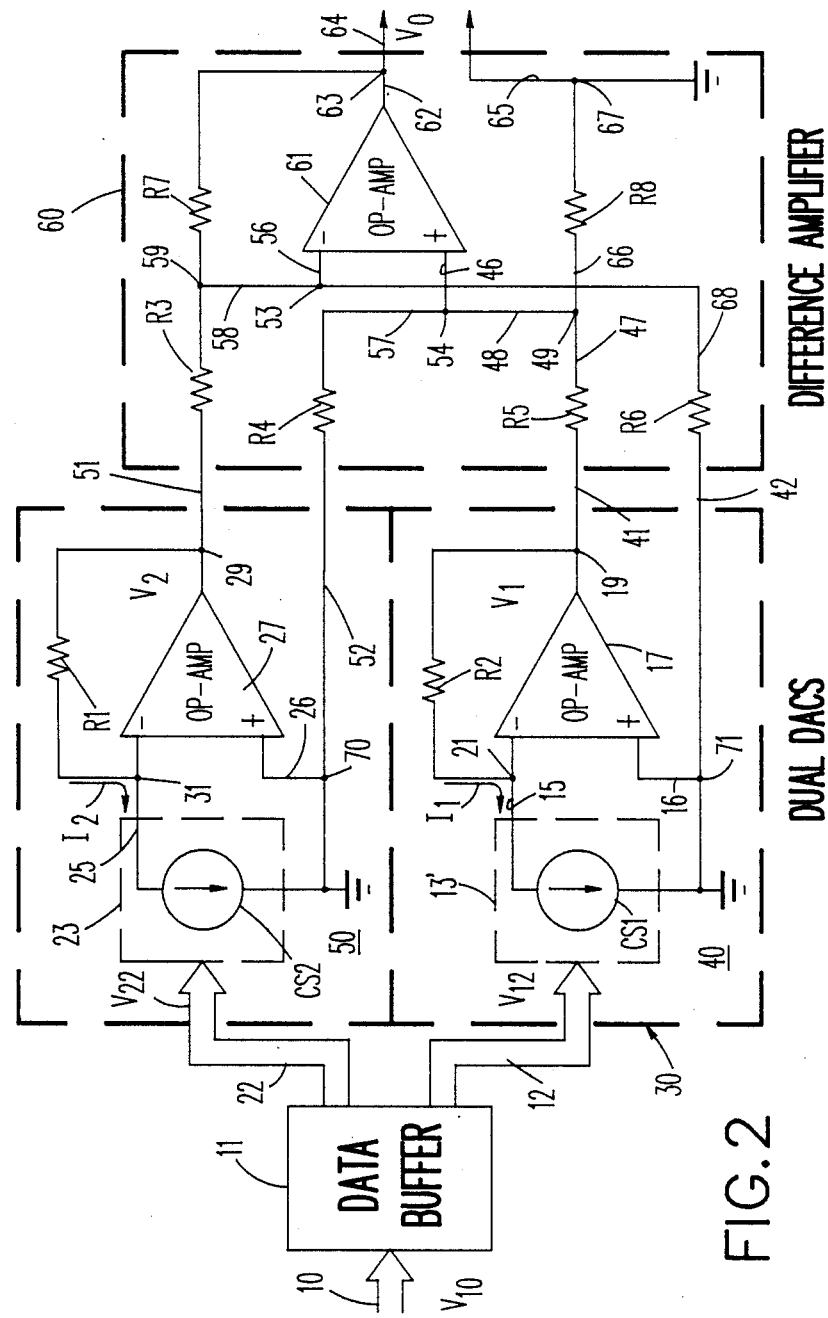
FIG. 2 shows an electrical schematic diagram of a preferred embodiment of this invention.

Referring to FIG. 2, where like elements from FIG. 1 have like numerals, what is shown includes data input bus 10, data buffer 11, and bus lines 12 and 22, to Dual DACs unit 30. Dual DACs unit 30 includes a pair of high accuracy DAC systems 40 and 50 generally of the kind shown in FIG. 1, (but without the offset circuits) and referring to FIG. 2 with an inversion of the digital input on bus line 22 from data buffer 11 to only one of the DAC systems, i.e. DAC system 50. The output currents from DAC systems 40 and 50 are separately supplied on the one hand on lines 41, 42, from DAC 40 and on the other hand, on lines 51 and 52 from DAC system 50 in Dual DACS unit 30 to difference amplifier 60.

Describing the schematic diagram of FIG. 2 in greater detail, a data input bus 10 carries data signals $V_{10}$ in digital form which pass to digital data buffer 11 from which they are supplied on bus line 12 as signals $V_{12}$ in parallel to DAC 13' in DAC system 40. DAC 13' includes a simple digital-to-analog circuit comprising current source CS1 with an output current $I_1$ representative of the input signal $V_{12}$. Output line 15 of DAC 13' is connected via node 21 to the negative input terminal of an inverting, op-amp 17, whose positive input is connected by line 16 to node 71 which is connected to ground. The output of op-amp 17 is connected to node 19 at voltage level $V_1$. Feedback resistor R2 is connected between node 21 and node 19.

DAC 50 is identical to DAC 40, but its input signal is inverted by digital data buffer 11. Digital data buffer 11 supplies inverted voltage, digital signal values $V_{22}$ on bus line 22, as contrasted to the digital signal values on bus line 12, in parallel to DAC 23 in DAC system 50. DAC 23 includes a simple digital- to-analog circuit illustrated in FIG. 2 as a current source CS2 between output line 25 and ground. Output line 25 of DAC 23 supplies current I2 through node 31 to the negative input terminal of an inverting op-amp 27, whose positive input is connected to ground by line 26 and node 70. The output of op-amp 27 is connected to node 29 which is at voltage level $V_2$. Feedback resistor R1 is connected between node 31 and node 29.

Then the output voltage $V_2$ of the inverted DAC system 50 is connected from node 29 on line 51 to produce a voltage level representing voltage $V_2$ which is to be subtracted from another voltage level representing the output voltage $V_1$ on line 41 from node 19 of the non-inverting DAC system 40.

Difference amplifier 60 includes resistor R3 connected at one end to line 51 from node 29 carrying voltage $V_2$. On its other end, resistor R3 is connected to node 59 which connects to one end of resistor R7, and line 58 to node 53, which connects via line 56 to the negative terminal of the op-amp 61 of difference amplifier 60. Functionally the interconnections of nodes 29, 59, and 53 couple the output voltage $V_2$ to the negative input of op-amp 61. Moving away from node 59, the other end of resistor R7 is connected to the node 63 at output voltage $V_O$ which connects the output 62 of the op-amp 61 to output line 64.

Difference amplifier 60 also includes resistor R4 which connects to line 52 which is the ground connection in DAC system 50. The other end of resistor R4 is connected via line 57 to node 54 which connects to the positive input line 46 to op-amp 61.

Another input to the difference amplifier 60 is line 41 from node 19 at voltage $V_1$ which connects to resistor R5 which also connects via line 47 to node 49 and via line 48 to node 54 to couple the output voltage $V_1$ from op-amp 17 to the positive input of op-amp 61. Node 49 is also connected via line 66 to one end of resistor R8. The other end of resistor R8 is connected through node 67 to ground and to the other output line 65 of difference amplifier 60.

The final input to difference amplifier 60 is line 42 which connects to the ground connection of DAC system 40. Line 42 connects to resistor R6 which is joined at its opposite end via line 68 to node 53.

Figure 3:
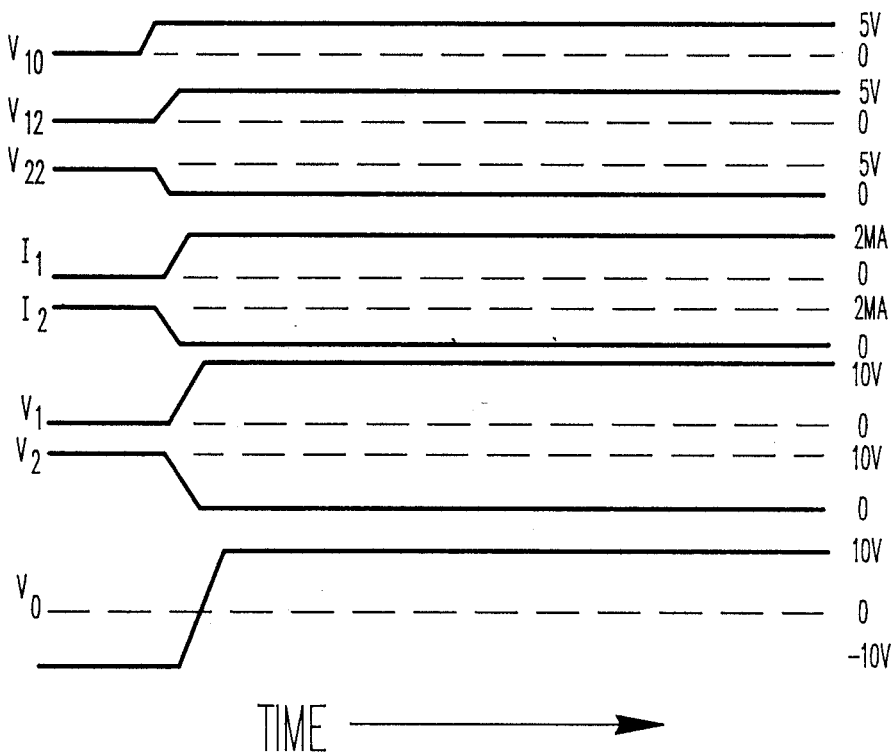
FIG. 3 shows a timing and signal diagram for the circuit of FIG. 2.

Thus the values of $V_1$ and $V_2$ are subtracted by the op-amp 61 as will be explained in greater detail below. FIG. 3 shows the timing and the signals $V_{10}$, $V_{12}$, $V_{22}$, $I_1$, $I_2$, as well as $V_1$, $V_2$ and $V_O$. Note that $V_O$ has a positive value when $V_1$ does, but that the amplitude change is doubled from $-10$ volts to $+10$ volts, as contrasted to between 0 and $+10$ volts.

If the full scale output of one DAC is 10 volts, then the operation of the combined DAC can be represented by Table I.

TABLE I

| DIGITAL VALUE | DAC 40 | DAC 50 | DAC 40–DAC 50 |
|---|---|---|---|
| + FULL SCALE | 10 V | 0 V | 10 V |
| ZERO | 5 V | 5 V | 0 V |
| – FULL SCALE | 0 V | 10 V | –10 V |

The signal and timing diagram shown in FIG. 3 can help to clarify the operation.

Similarly, Table II below lists the results obtained for the noise, defining "n" to be the noise of a DAC when the output is "10 V". It is assumed that uncorrelated noise adds in the root sum square manner.

TABLE II

| DIGITAL VALUE | DAC 40 | DAC 50 | DAC 40–DAC 50 |
|---|---|---|---|
| + FULL SCALE | n | 0 | n |
| ZERO | n/2 | n/2 | n/1.414 |
| – FULL SCALE | 0 | n | n |

For comparison, two similar tables can be drawn for the typical case where one DAC is used in bipolar mode with twice as much gain.

SIGNAL

TABLE III

| DIGITAL VALUE | BINARY SOURCES | OFFSET | OUTPUT |
|---|---|---|---|
| + FULL SCALE | 20 V | –10 V | 10 V |
| ZERO | 10 V | –10 V | 0 V |
| – FULL SCALE | 0 V | –10 V | –10 V |

But the noise figure will be that of the following table:

TABLE IV

| DIGITAL VALUE | BINARY SOURCES | OFFSET | OUTPUT |
|---|---|---|---|
| + FULL SCALE | 2n | n | 2.2 n |
| ZERO | n | n | 1.4 n |
| – FULL SCALE | 0 | n | n |

As can be seen by comprising the tables of noise figures, the combined DAC achieves greater than a 50% reduction in output noise.

Also, when using a single external voltage reference for both DACs, which is the preferred mode of operation, the noise values in both DACS due to the voltage reference will partially cancel each other because the output of one DAC is subtracted from that of the other, and the voltage reference noise is common to both to some degree at any particular time as determined by the digital bit settings at that time.

There are other uncorrelated noise sources in a DAC circuit, such as thermal noise, amplifier drift, offset, etc. Following the general principles of statistics, the sum total of noise values from those sources is reduced by the square root of two when two DACs are used.

In summary, in the physical embodiment of the invention, the digital word on bus 10 for controlling the desired DAC output is supplied to the data buffer 11 which generates the buffered and also the inverted (out of phase) digital outputs as explained above with reference to FIG. 2. The in-phase and the out-of-phase digital words are supplied on cables 12 and 22 to identical DACs 13' and 23 in units 40 and 50 respectively with the same full scale output currents.

Thus, the output current on line 15 from DAC 13' is always the complement of the output current on line 25 from DAC 23. Otherwise stated, $I_1$=(Full Scale current$-I_2$). DAC 13' and DAC 23 are both operated in the unipolar mode, i.e., no offset current is supplied to the DAC output nodes 21 and 31. The outputs of DAC 13' and DAC 23 are converted to voltages by the op-amps 17 and 27 respectively. The difference op-amp 61 subtracts the voltage $V_2$ on node 29 from the voltage $V_1$ on node 19 to produce $V_O = V_1 - V_2$ at node 63.

At minus ($-$) full scale of the digital input to digital data buffer 11, $I_1$ is zero, and $I_2$ is at full scale. If the full scale DAC current $I_2$ is $+2$ ma, and the feedback resistors 28 and R1 are both 5 kilohms, then $V_1=0$ while $V_2=10$ volts. The output $V_O=V_1-V_2=-10$ volts. The noise current of the DAC is 10 ppm, then the current noise from $I_1$ is zero, while the noise from $I_2$ is 20 na. The noise voltage of $V_1$ is zero, while that of $V_2$ is 20 na multiplied by 5 kilohms, yielding 100 nv.

At mid-range, where zero voltage output is desired, $I_1$ and $I_2$ are at mid-range of $+1$ ma each. The output voltage $V_1$ of the inverting op-amp 17 is 1 ma multiplied by 5 kilohms, yielding 5 volts, and similarly, $V_2=5$ volts. The output $V_O=V_1-V_2=0$ volts.

The noise current at 10 ppm is 10 na from $I_1$ and 10 na from $I_2$. The noise voltage of $V_1$ is 50 nv, and that of $V_2$ is also 50 nv. The total random noise is the root sum square of the two noise currents, which is 70.7 nv.

At plus ($+$) full scale of the digital input, $I_1$ is $+2$ ma while $I_2$ is zero. $V_1$ is 10 volts, while $V_2$ is zero. The output $V_O$ is $V_1-V_2=10$ volts. If the noise current of $I_2$ is 10 ppm, which is 20 na, while that of $I_2$ is zero. V6hd 1 has a noise voltage of 100 nv, while $V_2$ has no noise. The total noise is the root sum square of the noise of $V_1$ and $V_2$, yielding 100 nv.

By comparison to the system described above in connection with FIG. 1, there is an overall reduction in output noise for the same desired output voltages given the same inherent noise characteristics of the DACs. Particularly, the worst case noise is reduced from 223.6 nv to 100 nv, which is a noise reduction of over 55%.

All electronic devices produce noise and DACs are not an exception. If two devices are summed together with equal weighting their total noise will be given by the following:

Eq.1.

$$N_{total} = ((N_{DAC\ 13'})^2 + (N_{DAC\ 23})^2)^{.5}$$

where
$N_{DAC\ 13'}$ is the noise from device one,
$N_{DAC\ 23}$ is the noise from device two,
and $N_{total}$ is the total noise.

In other words the total noise is the Root Sum Square of the individual noise sources. In other words the total noise can be found by squaring the noise from the first device and adding to it the noise from the second device squared. Once the sum of the squares of the two noise sources is obtained, the square root is taken.

This noise analysis applies only to uncorrelated noise sources. That is noise sources that do not track or are totally independent.

If one needs a DAC output of 10 Volts we could use one DAC and have a noise contribution of $N_{DAC}$. If the sum of two DACs is taken there would be an output of 20 volts with a total noise as given above in equation 1. To achieve the desired 10 volts the sum of the two DACs is divided in half and the resultant noise is reduced to $N_{DAC}$ divided by the square root of 2. If the two DACs have the same amount of noise then we have the following:

Eq 2.

$$N_{total} = ((2 * (N_{DAC})^2)^{.5})/2$$

Where
$N_{DAC}$ is the noise from each DAC and
$N_{total}$ is the total noise from both DACS.
( * means times or multiplication )
$N_{total}$ equals the square root of the quantity NDAC 13' squared plus NDAC 23 squared.
Equation 2. simplifies to $$N_{total} = N_{DAC} * ((2)^{.5})/2 \text{ or} \quad \text{Eq 3.}$$
$$= N_{DAC}/(2)^{.5}$$

$$N_{total} = 1.414/2 * N_{DAC} \quad \text{Eq 4.}$$
$$= 0.707 * N_{DAC}$$
$$N_{total} = N_{DAC} * \text{(the square root of two divided by two).}$$

The first benefit of using dual DACs is that the total noise is reduced by approximately 30%. This benefit also applies to any uncorrelated DAC errors since they can be treated as noise. The result is independent of the number of bits used in a DAC or what is the value of it's total output, as long as the two DACs have the same output.

If the DACs are summed out of phase a second benefit is achieved. In this case, the output of one DAC 23 is subtracted from the output of DAC 13'. This is achieved by inverting the digital bits going to DAC 23 and summing DAC 23 out of phase with DAC 13'.

Now for a digital input of 00000000, DAC 13' will put out 0 volts and DAC 23 will put out 10 volts. The output of DAC 13' minus the output of DAC 23 will be $-10$ volts. Conversely for a digital input of 11111111, DAC 13' will have an output of 10 volts and DAC 23 will have an output of 0 volts. Now the output of DAC 13' minus the output of DAC 23 is 10 volts. As with the first case the total output is 20 volts, but it will swing both sides of zero volts.

The first advantage of taking the difference of two DACs over their sum is that the effects of DAC errors or differences in noise that occur at any input code will be cut in half.

An example of this is that the noise from many DACs increase toward the coding of all bits on, or in our 8 bit case 11111111. Thus with a input code of all ones or all zeroes one DAC will be at maximum noise and the other DAC will be at minimum noise. This extra noise from one DAC over the other will be cut in half.

At the center of the DACs ranges, the noise from each will be of the same magnitude and the total noise will still be 0.707 times the value from one DAC.

The third advantage of using the difference in output of two DACs is that no offset reference is necessary to produce an output that swings on both sides of zero volts. Most DACs are used with an offset reference to produce the desired output that swings on both sides of zero volts. This offset reference produces noise and may drift. This noise source is totally eliminated by using dual DACs summed out of phase because these references are not needed.

In summary the three advantages of Dual DACs are as follows:

(1) Equal magnitude noise is reduced by 30%, (2) Noise differences of one DAC over the other are reduced by 50%, (3) Noise and drift from the offset reference is totally eliminated.

Finally, the digital-to-analog converters discussed above have been shown and discussed in simplified form. However it should be noted that each of them may include within it a commercial digital-to analog converter and multiple operational amplifiers along with resistors, capacitors, inductors, transistors, and diodes. The sum of the noise and errors produced by all of these varieties of equipment are reduced as well.

INDUSTRIAL APPLICABILITY

This invention is applicable in electronic signal processing for automatic manufacturing apparatus such as E-beam exposure systems. This invention is also applicable to data processing (D.P.) systems which interface with analog systems. Such D.P. systems include personal computers, minicomputers, large scale computers and other data processing equipment.

What is claimed is:

1. A signal processing system for converting digitally coded input signals into analog signals comprising:
   (a) a digital data input and an inverter, said inverter having an inverter input and an inverter output, said inverter input being connected to said digital data input,
   (b) a first digital-to-analog converter having its input coupled to said digital data input, said first converter having a first output for providing a first analog output signal,
   (c) a second digital-to-analog converter having its input coupled to said inverter output, said second converter having a second output for providing a second analog output signal;
   (d) means for combining the outputs of said first and second digital-to-analog converters having
      (1) a first input connected to said first output to receive said first analog output signal and
      (2) a second input connected to said second output to receive said second analog output signal, whereby noise is reduced and accuracy of the conversion is enhanced.

2. A signal processing system in accordance with claim 1 wherein said means for combining includes means for subtractively combining said outputs of said first and second digital-to-analog converters.

3. A signal processing system in accordance with claim 1 wherein said means for combining comprises a difference amplifier including an operational amplifier connected for subtractively combining said outputs of said first and second digital-to-analog converters.

4. A signal processing system in accordance with claim 1 wherein each of said first and second digital-to-analog converters includes an operational amplifier and a current source, each of said operational amplifier having inputs and an output, one of said inputs being connected to said current source, the other of said inputs being connected as the input of said digital-to-analog converters, and said output of said operational amplifier being connected as said output of said digital-to-analog converters.

* * * * *